(12) United States Patent
Huang et al.

(10) Patent No.: US 11,737,212 B2
(45) Date of Patent: Aug. 22, 2023

(54) ELECTRONIC COMPONENT PACKAGE, ELECTRONIC ASSEMBLY, VOLTAGE REGULATION MODULE, AND VOLTAGE REGULATOR MEMBER

(71) Applicant: SHENNAN CIRCUITS CO., LTD., Shenzhen (CN)

(72) Inventors: Lixiang Huang, Shenzhen (CN); Hua Miao, Shenzhen (CN); Jin Dong, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 112 days.

(21) Appl. No.: 17/565,470

(22) Filed: Dec. 30, 2021

(65) Prior Publication Data

US 2023/0007772 A1 Jan. 5, 2023

Related U.S. Application Data

(63) Continuation of application No. PCT/CN2021/103809, filed on Jun. 30, 2021.

(51) Int. Cl.
*H05K 1/18* (2006.01)
*H05K 1/11* (2006.01)
*H05K 1/14* (2006.01)

(52) U.S. Cl.
CPC ............ *H05K 1/115* (2013.01); *H05K 1/144* (2013.01); *H05K 1/181* (2013.01); *H05K 1/185* (2013.01); *H05K 2201/041* (2013.01)

(58) Field of Classification Search
CPC ........ H05K 1/185; H05K 1/115; H05K 1/144; H05K 1/181; H05K 2201/041
See application file for complete search history.

(56) References Cited

U.S. PATENT DOCUMENTS

2021/0391271 A1* 12/2021 Hsu ..................... H01L 25/16

FOREIGN PATENT DOCUMENTS

| CN | 103906370 A | 7/2014 |
|---|---|---|
| CN | 105530765 A | 4/2016 |

(Continued)

OTHER PUBLICATIONS

International Search Report,International application No. PCT/CN2021/103809, dated Mar. 9, 2022(10 pages).

*Primary Examiner* — Sherman Ng

(57) ABSTRACT

Disclosed are an electronic component package, an electronic assembly, and a voltage regulation module. The electronic component package includes a substrate and a first electronic component. The substrate includes a first surface and a second surface; wherein the first surface is arranged with a first conductive layer, and the second surface is arranged with a second conductive layer. The substrate defines a first conductive hole connected to the first conductive layer and a second conductive hole connected to the second conductive layer. The first electronic component is received in the substrate and arranged with a first electrical connection terminal and a second electrical connection terminal; the first electrical connection terminal is connected to the first conductive layer through the first conductive hole, and the second electrical connection terminal is connected to the second conductive layer through the second conductive hole. The first electronic component is a passive electronic component.

18 Claims, 4 Drawing Sheets

(56) References Cited

FOREIGN PATENT DOCUMENTS

| | | | |
|---|---|---|---|
| CN | 108987371 | A | 12/2018 |
| CN | 112203394 | A | 1/2021 |
| CN | 112203413 | A | 1/2021 |
| TW | 200840430 | A | 10/2008 |
| TW | 200922429 | A | 5/2009 |
| WO | WO2019198241 | A1 | 10/2019 |

\* cited by examiner

ELECTRONIC COMPONENT PACKAGE, ELECTRONIC ASSEMBLY, VOLTAGE REGULATION MODULE, AND VOLTAGE REGULATOR MEMBER

CROSS REFERENCE

The present application is a continuation-application of International (PCT) Patent Application No. PCT/CN2021/103809, filed on Jun. 30, 2021, the entire contents of which are hereby incorporated by reference in its entirety.

TECHNICAL FIELD

The present disclosure relates to the field of electronic components production process technologies, and in particular to an electronic component package, an electronic assembly, a voltage regulation module, and a voltage regulator member.

BACKGROUND

With a large number of electronic assemblies applied, people are fonder of lighter and thinner electronic assemblies, so the arrangement and planning of each part of the electronic assemblies also get more and more attention.

Conventionally, in the case of electronic assemblies composed of electronic components, the electronic components are exposed in the air and spaced at a corresponding distance therebetween, in order to achieve a reasonable arrangement of space between the electronic components, enabling the electronic components to cooperate with each other.

It is found that in the related art, due to the exposure of the electronic components in the air, impurities in the air have a certain degree of corrosion on the electronic components, thereby causing the decline in the electrical performance of the electronic components. Multiple electronic components are combined and installed, resulting in an excessive volume, which is also a problem for installation and transportation.

SUMMARY OF THE DISCLOSURE

The present disclosure provides an electronic component package, an electronic assembly, and a voltage regulation module to solve the above problems existing in electronic components in the related art.

To solve the above technical problems, a first technical solution adopted by the present disclosure is to provide an electronic component package, comprising: a substrate, comprising a first surface and a second surface opposite to the first surface; wherein the first surface of the substrate is arranged with a first conductive layer, and the second surface of the substrate is arranged with a second conductive layer; the substrate defines a first conductive hole connected to the first conductive layer and a second conductive hole connected to the second conductive layer; and a first electronic component, received in the substrate and arranged with a first electrical connection terminal and a second electrical connection terminal; the first electrical connection terminal is connected to the first conductive layer through the first conductive hole, and the second electrical connection terminal is connected to the second conductive layer through the second conductive hole; wherein the first electronic component is a passive electronic component.

The present disclosure can provide an electronic component package, the passive electronic component received in the substrate, such that the passive electronic component is isolated with the outside world, so as to achieve the packaging of passive electronic component, thereby preventing the air impurities on the passive electronic component of corrosion which causes electrical performance decline. The packaged chip is also easier to install and transport. The first electrical connection terminal of the passive electronic component is connected to the first conductive layer on the first surface of the substrate through the first conductive hole, and the second electrical connection terminal is connected to the second conductive layer on the second surface of the substrate through the second conductive hole, thereby realizing the connection between the passive electronic component and the external circuit.

In some embodiments, the first electronic component is an inductive component.

In some embodiments, the substrate comprises a frame and defines a holding slot in the frame; the first electronic component is received in the holding slot and connected to an outside through the first electrical connection terminal.

In some embodiments, the first electrical connection terminal is arranged on a first face of the first electronic component, and the second electrical connection terminal is arranged on a second face of the first electronic component; the first face and the second face of the first electronic component are opposite to each other along a first direction; the first conductive hole and the second conductive hole are defined in the first direction; the first conductive hole is electrically connected to the first electrical connection terminal, and the second conductive hole is electrically connected to the second electrical connection terminal.

In some embodiments, the first conductive hole and the second conductive hole are blind holes.

In some embodiments, the first conductive hole is defined facing the first electrical connection terminal, and the second conductive hole is defined facing the second electrical connection terminal.

In some embodiments, the electronic component package further defines a first through hole and a second through hole through the substrate; the first through hole is arranged on a side of the first electronic component in a second direction, and the second through hole is arranged the other side of the first electronic component in the second direction; the second direction intersects with the first direction; the first through hole and the second through hole are configured for a through connection to the first surface and the second surface.

To solve the above technical problems, a second technical solution adopted by the present disclosure is to provide an electronic assembly, comprising: a substrate, comprising a first surface and a second surface opposite to the first surface; a first electronic component, received in the substrate and arranged with a first electrical connection terminal connected to the first surface and a second electrical connection terminal connected to the second surface; and a second electronic component, arranged on the second surface of the substrate and electrically connected to the second conductive terminal; wherein the second electronic component forms a stack with the first electronic component in a first direction, the first direction intersecting the first surface and the second surface of the substrate; wherein the first electronic component is a passive electronic component.

Therefore, the present disclosure can provide an electronic assembly that forms a stack of the second electronic component with the first electronic component in the first direction, thereby reducing the areas of the first electronic component and the second electronic component in the second direction that intersects perpendicularly with the first direction.

In some embodiments, the first electronic component is an inductive component.

In some embodiments, the substrate comprises a frame and defines a holding slot in the frame; the first electronic component is received in the holding slot and connected to an outside through the first electrical connection terminal.

In some embodiments, the first conductive hole and the second conductive hole are blind holes.

In some embodiments, the first conductive hole is defined facing the first electrical connection terminal, and the second conductive hole is defined facing the second electrical connection terminal.

In some embodiments, the second electronic component comprises an active electronic component.

In some embodiments, the second electronic component comprises at least one of: a switching component, an active chip, and a power management integrated circuit; the second conductive layer is a conductive pattern layer.

In some embodiments, the first electrical connection terminal is arranged on a first face of the first electronic component, and the second electrical connection terminal is arranged on a second face of the first electronic component; the first conductive hole is defined at an end of the first direction and electrically connected to the first electrical connection terminal; the second conductive hole is defined at the other end of the first direction and electrically connected to the second electrical connection terminal.

In some embodiments, the electronic component package further defines a first through hole and a second through hole through the substrate; the first through hole is arranged on a side of the first electronic component in a second direction, and the second through hole is arranged the other side of the first electronic component in the second direction; the second direction intersects with the first direction; the first through hole and the second through hole are configured for a through connection to the first surface and the second surface.

To solve the above technical problems, a third technical solution adopted by the present disclosure is to provide a voltage regulation module, comprising: a circuit board, wherein a surface of the circuit board is arranged with a conductive pattern layer; and an electronic assembly as described in the second technical solution, arranged on the circuit board and electrically connected to the conductive pattern layer of the circuit board; wherein the second electronic component, the substrate, and the circuit board form a stack in a first direction in turn; the first direction intersects with both the first surface and the second surface of the substrate.

In some embodiments, the second electronic component is arranged with a heat sink; the heat sink, the second electronic component, the first electronic component, and the circuit board form a stack in the first direction in turn, thereby achieving a heat dissipation of the electronic assembly.

BRIEF DESCRIPTION OF THE DRAWINGS

In order to more clearly illustrate the technical solutions in the embodiments of the present disclosure, the following is a brief description of the drawings to be used in the description of the embodiments. It is obvious that the following description of the attached drawings are only some of the embodiments of the present disclosure. For those skilled in the art, other accompanying drawings may be obtained from these drawings without creative effort.

DETAILED DESCRIPTION

The following will be a clear and complete description of the technical solutions in the embodiments of the present disclosure, in conjunction with the accompanying drawings in the embodiments of the present disclosure. Obviously, the described embodiments are only a part of the embodiments of the present disclosure, and not all of them. Based on the embodiments in the present disclosure, all other embodiments obtained by those skilled in the art without making creative work fall within the scope of the present disclosure.

The terms "first," "second," "third," "fourth," etc. (if present) in the specification, the claims, and the accompanying drawings of the present disclosure are intended to distinguish similar objects and not necessarily intended to describe a particular order or sequence. It should be understood that the data so used may be interchangeable, where appropriate, such that the embodiments of the present disclosure described herein, for example, can be implemented in an order other than those illustrated or described herein. Further, the terms "include" and "have", and any variations thereof, are intended to cover non-exclusive inclusion, e.g., a process, method, system, product, or device including a series of steps or units may not be limited to those steps or units clearly listed, but may include other steps or units that are not clearly listed or that are inherent to the process, method, product, or device.

Figure 1:
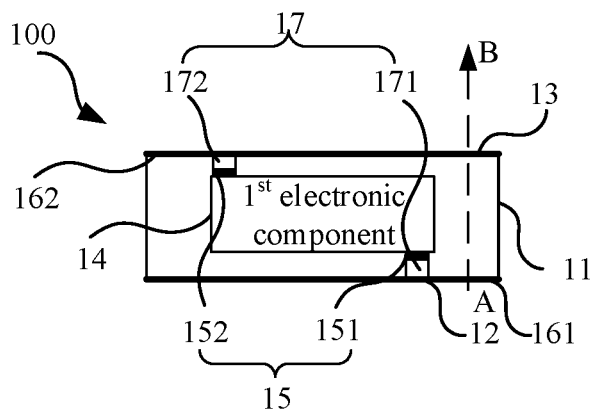
FIG. 1 is a structural schematic view of an electronic component package according to an embodiment of the present disclosure.

Referring to FIG. 1, FIG. 1 is a structural schematic view of an electronic component package according to an embodiment of the present disclosure. A first technical solution employed in the present disclosure provides an electronic component package 100 including: a substrate 11, a conductive layer 16 on a surface of the substrate 11, and a first electronic component 14. The first electronic component 14 is arranged with an electrical connection terminal 15, and the first electronic component 14 may be connected to the conductive layer 16 on the surface of the substrate 11 through the electrical connection terminal 15.

Specifically, the substrate 11, as a package, includes a first surface 12 and a second surface 13 opposite to the first surface 12. A first direction AB is defined according to the opposite arranged first surface 12 and second surface 13. The first direction AB may be a common longitudinal direction known by those skilled in the art, or other directions according to the need for specific settings, where A is an end of the first direction AB, and B is the other end of the first direction AB, thereby providing a directional division basis for determining arrangement and planning of components of the electronic component package 100.

The first surface 12 of the substrate 11 is arranged with a first conductive layer 161, and the second surface 13 of the substrate 11 is arranged with a second conductive layer 162. The substrate 11 defines a first conductive hole 171 connected to the first conductive layer 161, and a second conductive hole 172 connected to the second conductive layer 162.

The first electronic component 14 is received in the substrate 11 and arranged with a first electrical connection terminal 151 and a second electrical connection terminal 152. The first electrical connection terminal 151 is connected to the first conductive layer 161 through the first conductive hole 171, and the second electrical connection terminal 152 is connected to the second conductive layer 162 through the second conductive hole 172.

Specifically, when the first electronic component 14 is a passive electronic component 141, the passive electronic component 141 in the substrate 11 is electrically connected to the first conductive layer 161 through the first electrical connection terminal 151, and the passive electronic component 141 in the substrate 11 is electrically connected to the second conductive layer 162 through the second electrical connection terminal 152.

The present disclosure provides an electronic component package 100 in which the passive electronic component 141 is received in the substrate 11, such that the passive electronic component 141 is isolated from an outside, thereby realizing the encapsulation of the passive electronic component 141 to prevent the corrosion of the passive electronic component 141 by impurities in the air which causes electrical performance degradation. The encapsulated passive electronic component 141 is also more convenient for installation and transportation. The first electrical connection terminal 151 of the passive electronic component 141 is connected to the first conductive layer 161 of the first surface 12 of the substrate 11 through the first conductive hole 171, and the second electrical connection terminal 152 is connected to the second conductive layer 162 of the second surface 13 of the substrate 11 through the second conductive hole 172, thereby providing convenient conditions for realizing the connection of the passive electronic component 141 with an external circuit.

Further, the thickness of the electronic component package 100 may be 2 to 4 mm, such as 2 mm, 3 mm or 4 mm, and the first electronic component 14 of the electronic component package 100 may be an inductive component. In addition, the first electronic component 14 may also be a capacitive component, a resistive components and other components, which is selected according to needs without limitation. When the first electronic component 14 is selected to be an inductive component, the electronic assembly may be used as part of the voltage regulator, but also as an energy storage component. The inductive component may be a choke inductor or a chip inductor, which is not limited herein. The application as an inductor will be described in detail later on when the electronic assembly is included in a voltage regulation module.

Figure 2:
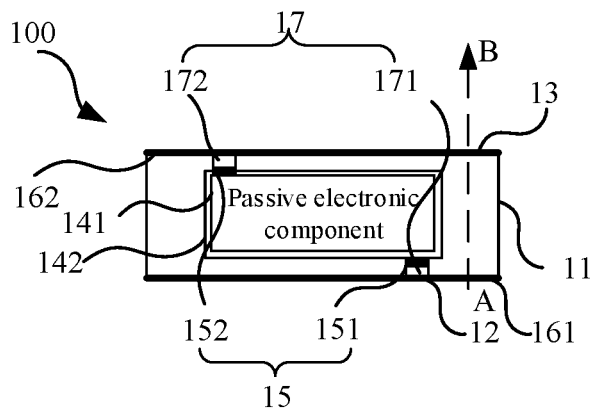
FIG. 2 is a structural schematic view of an electronic component package according to another embodiment of the present disclosure.

Further, referring to FIG. 2, FIG. 2 is a structural schematic view of an electronic component package according to another embodiment of the present disclosure. The substrate 11 of the electronic components package 100 includes a frame and a holding slot 142 is defined in the frame. The first electronic component 14 is received in the holding slot 142 and connected to the outside through the first electrical connection terminal 151. When the first electronic component 14 is received in the holding slot 142, the first electronic component 14 may be quickly received and smoothly placed in the substrate 11 through the holding slot 142.

The first electrical connection terminal 151 of the first electronic component 14 is led at an end of the holding slot 142 in the first direction AB to electrically connect to an external circuit, and the second electrical connection terminal 152 of the first electronic component 14 is led at the other end of the holding slot 142 in the first direction AB to electrically connect to the second electronic component 2.

Specifically, the electrical connection terminal 15 of the first electronic component 14 may be led through a surface of the holding slot 142 to or through the first surface 12 and the second surface 13 of the substrate 11. It is also possible to lead the electrical connection terminal 15 of the first electronic component 14 to or out of the first surface 12 and the second surface 13 of the substrate 11 by running from an inside of the holding slot 142 to the surface of the holding slot 142. Therefore, there are various methods of leading the electrical connection terminal 15, which can be selected as needed, and the details are not limited here.

The first electrical connection terminal and the second electrical connection terminal of the electronic component package 100 are arranged on the two sides of the first electronic component that are back-to-back along the first direction. The first conductive hole and the second conductive hole are defined along the first direction and are electrically connected to the first electrical connection terminal and the second electrical connection terminal, respectively.

Further, the first conductive hole 171 and the second conductive hole 172 of the electronic component package 100 are defined facing the first electrical connection terminal 151 and the second electrical connection terminal 152, respectively. That is, the first conductive hole 171 faces the first electrical connection terminal 151, and the second conductive hole 172 faces the second electrical connection terminal 152.

In addition, the electronic component package 100 further defines a first through hole 181 and a second through hole 182 through the substrate 11. The first through hole 181 and the second through hole 182 are arranged on both sides of the first electronic component 14 in a second direction CD. The second direction CD intersects with the first direction AB. The first through hole 181 and the second through hole 182 are both configured for through connection to the first surface 12 and the second surface 13.

Figure 3:
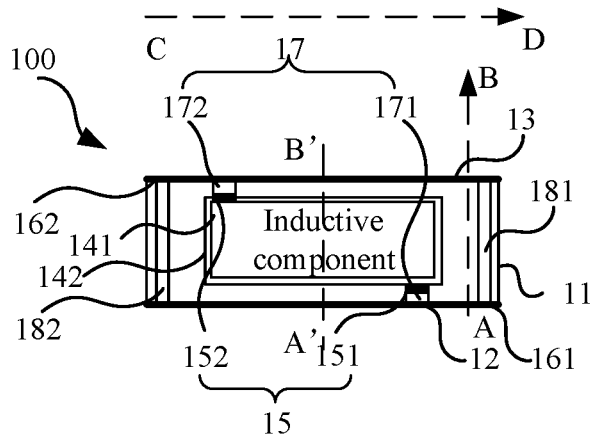
FIG. 3 is a structural schematic view of an electronic component package according to further another embodiment of the present disclosure.

Further, referring to FIG. 3, FIG. 3 is a structural schematic view of an electronic component package according to further another embodiment of the present disclosure. When there are multiple electronic components on the electronic component package 100, an insulating layer is arranged between the electronic components on the substrate 11. When the electronic components are required to be electrically connected to each other, the electronic components may be electrically connected on the electronic component package 100 through the first through hole 181 and the second through hole 182 of the substrate 11.

The second direction CD intersects the first direction AB, and specifically, the second direction CD may intersect the first direction AB vertically. The specific intersection is set according to the actual needs, which is not limited herein.

A middle of the first electronic component 14 has a center line A'B', as shown in FIG. 3. The first through hole 181 is arranged at an end D of the first electronic component 14 along the second direction CD, and the second through hole 182 is arranged at the other end C of the first electronic component 14 along the second direction CD. The distance of the first through hole 181 from the center line A'B" and the distance of the second through hole 182 from the center line A'B' may be equal, such that the first through hole 181 and the second through hole 182 may be arranged symmetrically at the opposite ends of the first electronic component 14 along the second direction AB. In some embodiments, the distance of the first through hole 181 or the second through hole 182 from the first electronic component 14 is greater than 200 um to prevent interlayer interference of the electronic components.

Figure 4:
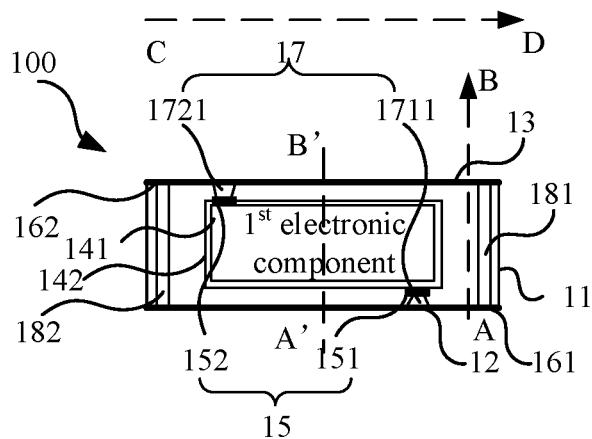
FIG. 4 is a structural schematic view of an electronic component package according to further another embodiment of the present disclosure.

Referring to FIG. 4, FIG. 4 is a structural schematic view of an electronic component package according to further another embodiment of the present disclosure. The first conductive hole 171 and the second conductive hole 172 of the electronic component package 100 are blind holes. Specifically, the first conductive hole 171 may be a first blind hole 1711, and the second conductive hole 172 may be a second blind hole 1721, that is, the substrate 11 defines the first blind hole 1711 connected to the first conductive layer 161 and the second blind hole 1721 connected to the second conductive layer 162. The first electrical connection terminal 151 is connected to the first conductive layer 161 through the first blind hole 1711, and the second electrical connection terminal 152 is connected to the second conductive layer 162 through the second blind hole 1721.

Therefore, as in the embodiment of FIG. 4, the first conductive hole is specifically implemented as the first blind hole 1711 and the second conductive hole is specifically implemented as the second blind hole 1721. The first blind hole 1711 is defined facing the first electrical connection terminal 151 and the second blind hole 1721 is defined facing the second electrical connection terminal 152. In this way, the first blind hole 1711 and the second blind hole 1721 may be connected to the electrical connection terminal 15 in a way that saves material and minimizes the risk of degradation of the electrical connection performance of the first blind hole 1711 and the second blind hole 1721 to the electrical connection terminal 15.

Figure 5:
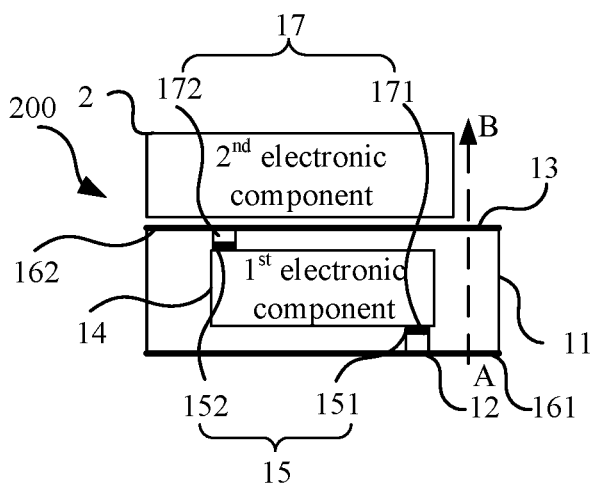
FIG. 5 is a structural schematic view of an electronic assembly according to an embodiment of the present disclosure.

A cross-section of the first blind hole 1711 and the second blind hole 1721 may be arranged in a trapezoidal shape along the first direction AB and arranged on the first face and the second face of the first electronic component 14, respectively. Specifically, the first blind hole 1711 has a trapezoidal shape with a large top and a small bottom, and is arranged on the first surface of the first electronic component 14. The first blind hole 1711 may exactly face the first electrical connection terminal 151, and may also partially face the first electrical connection terminal 151 to be electrically connected to the first electrical connection terminal 151. The second blind hole 1721 has a trapezoidal shape with a large top and a small bottom, and is arranged on the second surface of the first electronic component 14. The second blind hole 1721 may exactly face the second electrical connection terminal 152, and may also partially face the second electrical connection terminal 152 to be electrically connected to the second electrical connection terminal 152. Of course, the cross-sectional shape of the first blind hole 1711 and the second blind hole 1721 may also be other shapes. For example, as shown in FIG. 5, the cross-sectional shape of the first blind hole 1711 and the second blind hole 1721 may be rectangular or square. The size and shape of the first blind hole 1711 and the second blind hole 1721 may be the same or different, which can be selected depending on needs without limitation. It is to be noted that for each of the e first blind hole 1711 and the second blind hole 1721, a top refers to a side close to the outside and a bottom refers to a side far from the outside.

Referring to FIG. 5, FIG. 5 is a structural schematic view of an electronic assembly according to an embodiment of the present disclosure. A second technical solution adopted in the present disclosure provides an electronic assembly 200, including: a substrate 11, a first electronic component 14 and a second electronic component 2. The first electronic component 14 is received in the substrate 11 and is arranged with an electrical connection terminal 15. The first electronic component 14 in the substrate 11 is electrically connected to the second electronic component 2 through the electrical connection terminal 15.

The substrate 11, as a package, includes a first surface 12 and a second surface 13 opposite to the first surface 12. A first direction AB is defined according to the opposite arranged first surface 12 and second surface 13. The first direction AB may be a common longitudinal direction known by those skilled in the art, or other directions according to the need for specific settings, where A is an end of the first direction AB, and B is the other end of the first direction AB, thereby providing a directional division basis for determining arrangement and planning of components of the electronic component package 200.

The first electronic component 14, received in the substrate 11, may be a passive electronic component 141 and is arranged with a first electrical connection terminal 151 connected to the first surface 12 of the substrate 11 and a second electrical connection terminal 152 connected to the second surface 13. For receiving the first electronic component 14, the first electronic component 14 may be customarily common buried in the substrate 11, a medium is filled, and the electrical connection terminal 15 is exposed to achieve electrical connection to the second electronic component 2 and an external circuit outside the electronic assembly 200. Alternatively, for receiving the first electronic component 14, a portion of a medium may be first filled in the substrate, a position of the first electronic component 14 is adjusted in the substrate through the electrical connection terminal 15 such that the first electronic component 14 can be smoothly buried in the substrate 11, remaining medium is filled on the first electronic component 14, and then the electrical connection terminal 15 is exposed to achieve electrical connection to the second electronic component 2 and an external circuit outside the electronic assembly 200. Of course, those skilled in the art can bury the first electronic component 14 in the substrate 11 in a way that is customary and common in the related art, which is not limited herein.

The first surface 12 of the substrate 11 is arranged with a first conductive layer 161, and the second surface 13 of the substrate 11 is arranged with a second conductive layer 162.

The first electronic component 14 in the substrate 11 is electrically connected to the first conductive layer 161 through the first electrical connection terminal 151, and the first electronic component 14 in the substrate 11 is electrically connected to the second conductive layer 162 and the second electronic component 2 through the second electrical connection terminal 152.

Moreover, the substrate 11 further defines a first conductive hole 171 connected to the first conductive layer 161 and a second conductive hole 172 connected to the second conductive layer 162. The first electrical connection terminal 151 of the first electronic component 14 is electrically connected to the first conductive layer 161 through the first conductive hole 171, and the second electrical connection terminal 152 of the first electronic component 14 is electrically connected to the second conductive layer 162 and the second electronic component 2 through the second conductive hole 172.

The second electronic component 2 of the electronic assembly 200 is arranged on the second surface 13 of the substrate 11 and is electrically connected to the second electrical connection terminal 152. The second electronic component 2 may be electrically connected to the first electronic component 14 through the exposed second electrical connection terminal 152 on the second surface 13 of the substrate 11. Alternatively, it is also possible to electrically connect the second electrical connection terminal 152 of the first electronic component 14 to the second electronic component 2 through conductive solder by spotting the conductive solder on the second surface 13 of the substrate 11. Other specific settings can be made according to other specific situations, which are not limited herein.

The second electronic component 2 and the substrate 11 form a stack in the first direction AB. The first direction AB intersects with the first surface 12 of the substrate 11 and the second surface 13. In order to be more convenient to understand and draw, the first direction AB drawn in the drawings vertically intersects with the first surface 12 and the second surface 13. Of course, the first direction AB may be set to intersect with the first surface 12 and the second surface 13 of the substrate 11 not vertically, which is not limited herein.

Therefore, the present disclosure can provide an electronic assembly 200 to stack the second electronic component 2 with the substrate 11 in the first direction AB, thereby reducing an area of the substrate 11 and the second electronic component 2 in the second direction which intersects with the first direction AB vertically, and thereby keeping the second electronic component 2 away from other circuit devices other than the electronic assembly 200, so as to improve the heat dissipation efficiency of the second electronic component 2.

Figure 6:
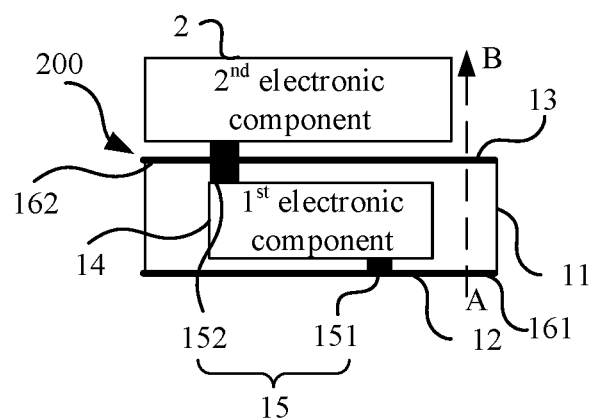
FIG. 6 is a structural schematic view of an electronic assembly according to another embodiment of the present disclosure.
Figure 7:
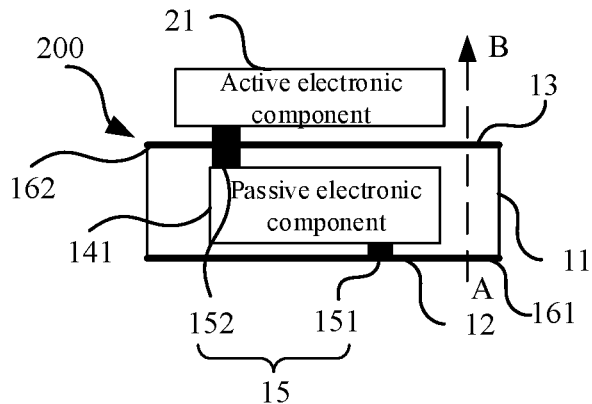
FIG. 7 is a structural schematic view of an electronic assembly according to further another embodiment of the present disclosure.

Further, referring to FIGS. 6 and 7, FIG. 6 is a structural schematic view of an electronic assembly according to another embodiment of the present disclosure, and FIG. 7 is a structural schematic view of an electronic assembly according to further another embodiment of the present disclosure. The first electronic component 14 of the electronic assembly 200 is a passive electronic component 141, and the second electronic component 2 includes an active electronic component 21.

Specifically, the substrate 11, as a package, includes a first surface 12 and a second surface 13 opposite to the first surface 12. The passive electronic component 141 is received in the substrate 11 and is arranged with a first electrical connection terminal 151 connected to the first surface 12 of the substrate 11 and a second electrical connection terminal 152 connected to the second surface 13. The active electronic component 21 is arranged on the second surface 13 of the substrate 11 and is electrically connected to the second electrical connection terminal 152.

Therefore, the present disclosure can provide an electronic assembly 200 in which the passive electronic component 141 is received in the substrate 11. The passive electronic component 141 is electrically connected to the active electronic component 21 and to other circuits other than the electronic assembly 200 through the electrical connection terminal 15, and the active electronic component 21 is stacked with the passive electronic component 141 in the first direction AB, thereby reducing the area of the passive electronic component 141 and the active electronic component 21 in the second direction CD intersecting with the first direction AB, and thereby keeping the second electronic component 2 away from other circuit devices other than the electronic assembly 200, so as to improve the heat dissipation efficiency of the second electronic component 2.

Figure 8:
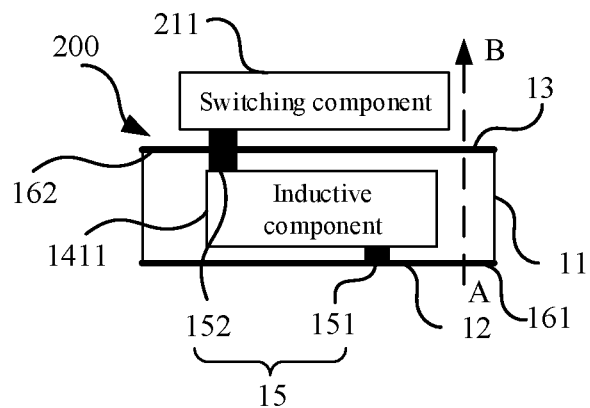
FIG. 8 is a structural schematic view of an electronic assembly according to further another embodiment of the present disclosure.

Further, the electronic assembly 200 may not define the first conductive hole 171 and the second conductive hole 172. Referring to FIG. 8, FIG. 8 is a structural schematic view of an electronic assembly according to further another embodiment of the present disclosure. The first electronic component 14 of the electronic assembly 200 may be an inductive component 1411, and the second electronic component 2 includes at least one of a switching component, an active chip, and a power management integrated circuit, which can be selected according to the needs without limitation.

Specifically, the substrate 11, as a package, includes a first surface 12 and a second surface 13 opposite to the first surface 12. The inductive component 1411 is received in the substrate 11 and is arranged with a first electrical connection terminal 151 connected to the first surface 12 of the substrate 11 and a second electrical connection terminal 152 connected to the second surface 13. A switching component 211 is arranged on the second surface 13 of the substrate 11 and is electrically connected to the second electrical connection terminal 152.

Therefore, the present disclosure can provide an electronic assembly 200 in which the inductive component 1411 is received in the substrate 11. The inductive component 1411 is electrically connected to the switching component 211 and to other circuits other than the electronic assembly 200 through the electrical connection terminal 15, and the switching component 211 is stacked with the substrate 11 in the first direction AB, thereby reducing the area and the size of the substrate 11 and the switching component 211 in the second direction CD intersecting the first direction AB, and thereby keeping the second electronic component 2 away from other circuit devices other than the electronic assembly 200, so as to improve the heat dissipation efficiency of the second electronic component 2.

In the first direction AB, the second electronic component placed on the substrate 11 may be a switching component 211, such as a triode, a MOS tube, and other semiconductor component products, such as a capacitor or a power management integrated circuit (PMIC), which can be selected according to the needs without limitation.

Figure 9:
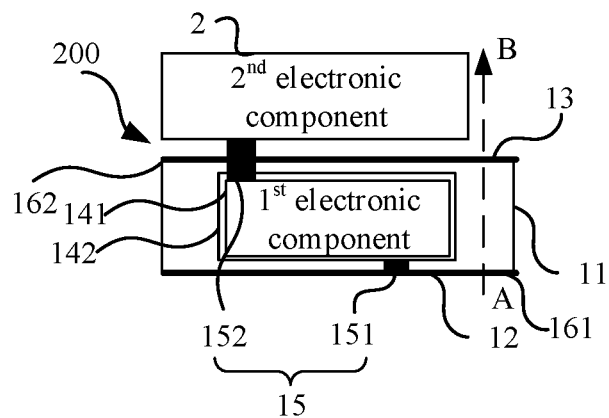
FIG. 9 is a structural schematic view of an electronic assembly according to further another embodiment of the present disclosure.

Further, referring to FIG. 9, FIG. 9 is a structural schematic view of an electronic assembly according to further another embodiment of the present disclosure. The substrate 11 of the electronic assembly 200 defines a holding slot 142. The first electronic component 14 is received in the holding slot 142 and is electrically connected to the outside through the first electrical connection terminal 151. When the first electronic component 14 is received in the holding slot 142, the first electronic component 14 can be quickly received and smoothly placed in the substrate 11 through the holding slot 142.

The first electrical connection terminal 151 of the first electronic component 14 is led at an end of the holding slot 142 in the first direction AB to electrically connect to an external circuit, and the second electrical connection terminal 152 of the first electronic component 14 is led at the other end of the holding slot 142 in the first direction AB to electrically connect to the second electronic component 2.

Specifically, the electrical connection terminal 15 of the first electronic component 14 may be led through a surface of the holding slot 142 to or through the first surface 12 and the second surface 13 of the substrate 11. It is also possible to lead the electrical connection terminal 15 of the first electronic component 14 to or out of the first surface 12 and the second surface 13 of the substrate 11 by running from an inside of the holding slot 142 to the surface of the holding slot 142. Therefore, there are various methods of leading the electrical connection terminal 15, which can be selected as needed, and the details are not limited here.

Further, referring to FIG. 5, the first surface 12 of the substrate 11 of the electronic assembly 200 is arranged with the first conductive layer 161, the first conductive layer 161 may be a whole metal layer such as a copper layer, aluminum layer or gold layer, etc., or may be a metal layer with a conductive pattern. The second surface 13 of the substrate is arranged with the second conductive layer 162, the second conductive layer 162 may be a whole metal layer such as a copper layer, aluminum layer or gold layer, or may be a metal layer with a conductive pattern. Specifically, for example, when an active electronic component 21 is placed on the second surface 13, the second conductive layer 162 may be a whole metal layer; and when more than one active electronic component 21 is placed on the second surface 13, the second conductive layer 162 may be a patterned layer.

In addition, referring to FIGS. 3-5, the substrate 11 further defines the first conductive hole 171 connected to the first conductive layer 161, and the second conductive hole 172 connected to the second conductive layer 162. The first electrical connection terminal 151 is connected to the first conductive layer 161 through the first conductive hole 171, and the second electrical connection terminal 152 is connected to the second conductive layer 162 through the second conductive hole 172.

Specifically, the first conductive hole 171 may be a first blind hole 1711, and the second conductive hole 172 may be a second blind hole 1721, that is, the substrate 11 defines the first blind hole 1711 connected to the first conductive layer 161 and the second blind hole 1721 connected to the second conductive layer 162. The first electrical connection terminal 151 is connected to the first conductive layer 161 through the first blind hole 1711, and the second electrical connection terminal 152 is connected to the second conductive layer 162 through the second blind hole 1721.

The first electrical connection terminal 151 and the second electrical connection terminal 152 of the electronic assembly 200 may be arranged on the two sides of the first electronic component 14 that are back-to-back along the first direction AB, that is, the first electrical connection terminal 151 of the electronic assembly 200 is arranged on a first face of the first electronic component 14 at the end A along the first direction AB, and the second electrical connection terminal 152 of the electronic assembly 200 is arranged on a second face of the first electronic component 14 at the other end B along the first direction AB.

The first face may be the first surface 12 or a surface intersecting the first surface 12, and the second face may be the second surface 13 or a surface intersecting the second surface 13, which may be selected as needed without limitation.

Specifically, when the first direction AB is longitudinal, the first electrical connection terminal 151 of the electronic assembly 200 may be arranged on the first electronic component 14 along the longitudinal direction perpendicular to the first face and within the substrate 11, and the second electrical connection terminal 152 of the electronic assembly 200 is arranged on the first electronic component 14 along the longitudinal direction perpendicular to the second face and within the substrate 11.

Of course, the electrical connection terminal 15 may not necessarily be perpendicular to the first face as well as the second face, while the first electrical connection terminal 151 may intersect with the first face, and the second electrical connection terminal 152 may intersect with the second face.

The first conductive hole 171 and the second conductive hole 172 are defined along the first direction AB, and electrically connected with the first electrical connection terminal 151, the second electrical connection terminal 152, correspondingly. That is, the first conductive hole 171 is defined along the end A of the first direction AB and is electrically connected to the first electrical connection terminal 151, and the second conductive hole 172 is defined along the other end B of the first direction AB and is electrically connected to the second electrical connection terminal 152.

In this way, when the first direction AB is longitudinal, the first conductive hole 171 is defined along the interior of the substrate 11 at the bottom of the longitudinal direction, such that the first conductive hole 171 is electrically connected to the first electrical connection terminal 151 at the lower end of the first electronic component 14 at the bottom of the longitudinal direction; the second conductive hole 172 is defined along the interior of the substrate 11 at the top of the longitudinal direction, such that the second conductive hole 172 is electrically connected to the second electrical connection terminal 152 at the upper end of the electronic component 14 at the top of the longitudinal direction.

Figure 10:
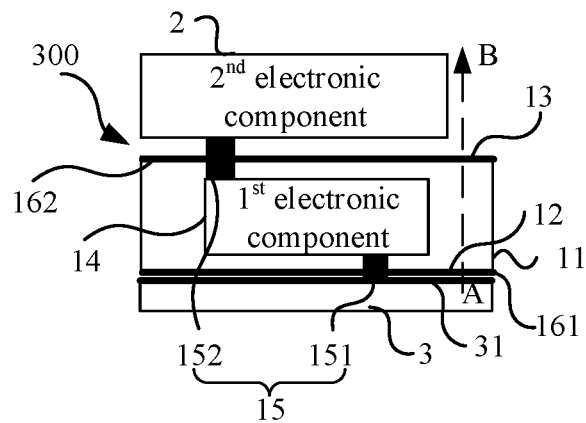
FIG. 10 is a structural schematic view of a voltage regulation module according to an embodiment of the present disclosure.

Further, in order to solve the above technical problems, another technical solution adopted in the present disclosure is to provide a voltage regulation module. Referring to FIG. 10, FIG. 10 is a structural schematic view of a voltage regulation module according to an embodiment of the present disclosure. The voltage regulation module 300 includes a circuit board 3 and an electronic assembly 200 as described above. The electronic assembly 200 is electrically connected to the circuit board 3.

Specifically, a surface of the circuit board 3 is arranged with a conductive pattern layer 31, and the conductive pattern layer 31 is electrically connected to the electronic assembly 200 through the electrical connection terminal 15. In this way, the electronic assembly 200 is arranged on the circuit board 3 and electrically connected to the conductive pattern layer 31 of the circuit board 3. The electronic assembly 200 may be such as the above electronic assembly.

Among them, the second electronic component 2, the substrate 11 and the circuit board 3 form a stack in the first direction AB in turn. The first direction AB intersects with both the first surface 12 and the second surface 13 of the substrate 11. Specifically, as shown in FIG. 10, the first direction AB may intersect the first surface 12 and the second surface 13 of the substrate 11 both vertically.

Therefore, the present disclosure can provide a voltage regulation module 300 that forms a stack of the second electronic component 2, the substrate 11 and the circuit board 3 in turn in the first direction AB, thereby reducing the area as well as the body size of the second electronic component 2, the substrate 11 and the circuit board 3 in the second direction CD that intersects perpendicularly with the first direction AB, and further keeping the second electronic component 2 away from other circuit devices other than the electronic assembly 200 (e.g., keeping the second electronic component 2 away from the circuit board 3), so as to improve the heat dissipation efficiency of the second electronic component 2.

In the first direction AB, the first electronic component 14 placed on the substrate 11 may be an inductive component 1411, the inductive component 1411 may be arranged with a switching component 211, such as a triode, a MOS tube, and other semiconductor component products, such as a capacitor or a PMIC. When the circuit board is a printed circuit board (PCB) motherboard, the inductive component 1411 may be sunk into the PCB motherboard; the PMIC, resistor, and capacitor may be attached to the inductor unit; and external surfaces of the PMIC, resistor, and capacitor may be performed with heat dissipation treatment. When the PMIC is a plastic sealed part, the PMIC does not need to be performed with a secondary plastic seal.

Further, the second electronic component 2 is arranged with a heat sink. The heat sink, the second electronic component 2, the first electronic component 14, and the circuit board form a stack in the first direction AB in turn, thereby achieving the heat dissipation of the electronic assembly 200.

Figure 11:
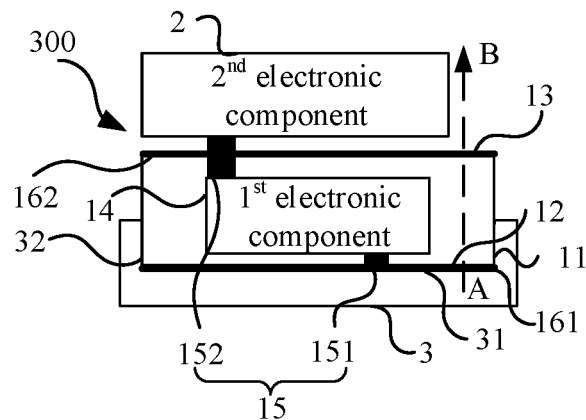
FIG. 11 is a schematic view of a specific structure of the voltage regulation module as shown in FIG. 10.

Further, referring to FIG. 11, FIG. 11 is a schematic view of a specific structure of the voltage regulation module as shown in FIG. 10. The circuit board 3 defines a recess 32 on a side near the first surface 12, and the recess 32 may be configured to partially receive the substrate 11. Specifically, a bottom surface of the recess 32 is arranged with the conductive pattern layer 31, which may be configured for electrical connection with the first electrical connection terminal 151.

When there is a plurality of electronic assemblies 200, the plurality of electronic assemblies 200 may be arranged on the circuit board 3; the recess 32 may be configured to partially received the substrate 11 of an electronic assembly 200; the substrates of some electronic assemblies 200 may be partially received in the circuit board 3; the substrates of all the electronic assemblies 200 may be partially received in the circuit board 3, which may be selected as needed without limitation.

Specifically, the first electronic component 14 of the electronic assembly 200 may be an inductive component 1411, and the second electronic component 2 may include a switching component 211. When applied as an inductor, the electronic assembly 200 forms the voltage regulation module 300, the inductive component 1411 may be configured as part of the voltage regulation module 300 in the electronic assembly 200, and may also be configured as an energy storage component. When used for the voltage regulation module 300, the inductive component 1411 may a choke inductor or a chip inductor.

When the inductive component 1411 is a choke inductor, the inductive component 1411 is molded in one piece and is an encapsulated shielded inductor. When the voltage regulation module 300 is electrically connected to an external power supply and a load, and the voltage at both ends of the load is reduced, the external power supply charges the choke inductor through the switching component 211, such that the load reaches a required rated voltage. When the voltage of the load electrically connected to the voltage regulation module 300 rises, the switching action of the switching component 211 makes the external power supply disconnect the choke inductor to release energy and continue to supply power to the load.

When the inductive component 1411 is a chip inductor, and when the voltage regulation module 300 is electrically connected to the external power supply and the load, and the voltage at both ends of the load decreases, the external power supply charges the chip inductor through the switching component 211, such that the load reaches the required rated voltage. When the voltage regulation module 300 electrically connected to the load ends of the voltage rises, the switching action of the switching component 211 makes the external power supply disconnect the chip inductor to release energy and continue to supply power to the load.

Based on the above related technical solutions proposed by the present disclosure, the inductive component 1411 is received in the PCB board. The chip containing the triode is exposed outside the PCB and arranged above the inductive component 141. The use of longitudinal stacking type for this design and construction, and set the heat sink or heat dissipation parts on the chip to promote the heat dissipation effect of the voltage regulation module 300. Although the thickness of the voltage regulation module 300 increases in the first direction AB, while the manufacturing area in the second direction CD decreases. Considering the blind hole is limited by the thickness of the medium, the increased thickness of the voltage regulation module 300 in the first direction AB is conducive to better set the blind hole.

In addition, for the power density U=P/S, when the power P of the voltage regulation module 300 remains unchanged and the area S in the first direction AB reduces, the heat dissipation performance of the second electronic component 2 increases, i.e., the calculated power of the voltage regulation module 300 increases, i.e., the number of on-offs in the insulated gate bipolar transistor (IGBT) in the second electronic component 2 increases. In this way, the power density of the voltage regulation module 300 is increased and the performance of the voltage regulation module 300 is improved, making it available for a wide range of applications in the CPU and GPU fields. IGBT is a composite fully controlled voltage driven power semiconductor device consisting of a bipolar junction transistor (BJT) and an insulated gate field effect tube (MOS), which has the advantages of both.

Figure 12:
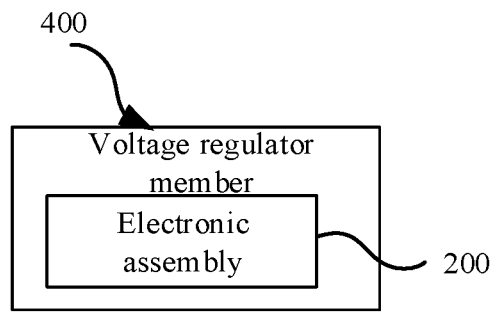
FIG. 12 is a structural schematic view of a voltage regulator member according to an embodiment of the present disclosure.

To solve the above technical problems, another technical solution adopted in the present disclosure is to also provide a voltage regulator member 400. Referring to FIG. 12, FIG. 12 is a structural schematic view of a voltage regulator member according to an embodiment of the present disclosure. The voltage regulator member 400 includes the above-mentioned electronic assembly 200.

The above is only examples of the present disclosure, but not to limit the scope of the present disclosure. Any equivalent structure or equivalent process transformation made by using the contents of the specification and the attached drawings of the present disclosure, or directly or indirectly applied in other related technical fields, are included in the scope of the present disclosure.

What is claimed is:

1. An electronic component package, comprising: a substrate, comprising a first surface and a second surface opposite to the first surface; wherein the first surface of the substrate is arranged with a first conductive layer, and the second surface of the substrate is arranged with a second conductive layer; the substrate defines a first conductive hole connected to the first conductive layer and a second conductive hole connected to the second conductive layer; and a first electronic component, received in the substrate and arranged with a first electrical connection terminal and a second electrical connection terminal; the first electrical connection terminal is connected to the first conductive layer through the first conductive hole, and the second electrical connection terminal is connected to the second conductive layer through the second conductive hole; wherein the first electronic component is a passive electronic component; wherein the substrate comprises a frame and defines a holding slot in the frame; the first electronic component is received in the holding slot and connected to an outside through the first electrical connection terminal.

2. The electronic component package according to claim 1, wherein the first electronic component is an inductive component.

3. The electronic component package according to claim 1, wherein the first electrical connection terminal is arranged on a first face of the first electronic component, and the second electrical connection terminal is arranged on a second face of the first electronic component; the first face and the second face of the first electronic component are opposite to each other along a first direction; the first conductive hole and the second conductive hole are defined in the first direction; the first conductive hole is electrically connected to the first electrical connection terminal, and the second conductive hole is electrically connected to the second electrical connection terminal.

4. The electronic component package according to claim 1, wherein the first conductive hole and the second conductive hole are blind holes.

5. The electronic component package according to claim 1, wherein the first conductive hole is defined facing the first electrical connection terminal, and the second conductive hole is defined facing the second electrical connection terminal.

6. The electronic component package according to claim 3, wherein the electronic component package further defines a first through hole and a second through hole through the substrate; the first through hole is arranged on a side of the first electronic component in a second direction, and the second through hole is arranged the other side of the first electronic component in the second direction; the second direction intersects with the first direction; the first through hole and the second through hole are configured for a through connection to the first surface and the second surface.

7. An electronic assembly, comprising: a substrate, comprising a first surface and a second surface opposite to the first surface; wherein the first surface of the substrate is arranged with a first conductive layer, and the second surface of the substrate is arranged with a second conductive layer; the substrate defines a first conductive hole connected to the first conductive layer and a second conductive hole connected to the second conductive layer; a first electronic component, received in the substrate and arranged with a first electrical connection terminal and a second electrical connection terminal; the first electrical connection terminal is connected to the first conductive layer through the first conductive hole, and the second electrical connection terminal is connected to the second conductive layer through the second conductive hole; and a second electronic component, arranged on the second surface of the substrate and electrically connected to the second conductive layer; wherein the second electronic component forms a stack with the first electronic component in a first direction, the first direction intersecting the first surface and the second surface of the substrate; wherein the first electronic component is a passive electronic component; wherein the substrate comprises a frame and defines a holding slot in the frame; the first electronic component is received in the holding slot and connected to an outside through the first electrical connection terminal.

8. The electronic assembly according to claim 7, wherein the first electronic component is an inductive component.

9. The electronic assembly according to claim 7, wherein the first conductive hole and the second conductive hole are blind holes.

10. The electronic assembly according to claim 7, wherein the first conductive hole is defined facing the first electrical connection terminal, and the second conductive hole is defined facing the second electrical connection terminal.

11. The electronic assembly according to claim 7, wherein the second electronic component comprises an active electronic component.

12. The electronic assembly according to claim 11, wherein the second electronic component comprises at least one of: a switching component, an active chip, and a power management integrated circuit; the second conductive layer is a conductive pattern layer.

13. The electronic assembly according to claim 7, wherein the first electrical connection terminal is arranged on a first face of the first electronic component, and the second electrical connection terminal is arranged on a second face of the first electronic component; the first face and the second face of the first electronic component are opposite to each other along a first direction; the first conductive hole is defined at an end of the first direction and electrically connected to the first electrical connection terminal; the second conductive hole is defined at the other end of the first direction and electrically connected to the second electrical connection terminal.

14. The electronic assembly according to claim 13, wherein the electronic component package further defines a first through hole and a second through hole through the substrate; the first through hole is arranged on a side of the first electronic component in a second direction, and the second through hole is arranged the other side of the first electronic component in the second direction; the second direction intersects with the first direction; the first through hole and the second through hole are configured for a through connection to the first surface and the second surface.

15. A voltage regulation module, comprising: a circuit board, wherein a surface of the circuit board is arranged with a conductive pattern layer; and an electronic assembly, arranged on the circuit board and electrically connected to the conductive pattern layer of the circuit board; wherein the electronic assembly comprises: a substrate, comprising a first surface and a second surface opposite to the first surface; wherein the first surface of the substrate is arranged with a first conductive layer, and the second surface of the substrate is arranged with a second conductive layer; the substrate defines a first conductive hole connected to the first conductive layer and a second conductive hole connected to the second conductive layer; a first electronic component, received in the substrate and arranged with a first electrical connection terminal and a second electrical connection terminal; the first electrical connection terminal is connected to the first conductive layer through the first conductive hole, and the second electrical connection terminal is connected to the second conductive layer through the second conductive hole; and a second electronic component, arranged on the second surface of the substrate and electrically connected to the second conductive layer; wherein the second electronic component forms a stack with the first electronic component in a first direction, the first direction intersecting the first surface and the second surface of the substrate; wherein the first electronic component is a passive electronic component; wherein the substrate comprises a frame and defines a holding slot in the frame; the first electronic component is received in the holding slot and connected to an outside through the first electrical connection terminal; wherein the second electronic component, the substrate, and the circuit board form a stack in a first direction in turn; the first direction intersects with both the first surface and the second surface of the substrate.

16. The voltage regulation module according to claim 15, wherein the second electronic component is arranged with a heat sink; the heat sink, the second electronic component, the first electronic component, and the circuit board form a stack in the first direction in turn, thereby achieving a heat dissipation of the electronic assembly.

17. The voltage regulation module according to claim 15, wherein the first electrical connection terminal is arranged on a first face of the first electronic component, and the second electrical connection terminal is arranged on a second face of the first electronic component; the first face and the second face of the first electronic component are opposite to each other along a first direction; the first conductive hole is defined at an end of the first direction and electrically connected to the first electrical connection terminal; the second conductive hole is defined at the other end of the first direction and electrically connected to the second electrical connection terminal.

18. The voltage regulation module according to claim 17, wherein the electronic component package further defines a first through hole and a second through hole through the substrate; the first through hole is arranged on a side of the first electronic component in a second direction, and the second through hole is arranged the other side of the first electronic component in the second direction; the second direction intersects with the first direction; the first through hole and the second through hole are configured for a through connection to the first surface and the second surface.

* * * * *